United States Patent [19]

Redmond et al.

[11] 4,078,096

[45] Mar. 7, 1978

[54] METHOD OF MAKING SENSITIZED POLYIMIDE POLYMERS, HAVING CATALYST AND ELECTROLESS METAL, METAL DEPOSITS THEREON AND CIRCUIT PATTERNS OF VARIOUS METALLIZATION SCHEMES

[75] Inventors: John Peter Redmond, Mechanicsburg; Albert Shirk, Palmyra; Elmer John Bottiglier, Harrisburg; Richard Henry Zimmerman, Palmyra, all of Pa.

[73] Assignee: AMP Incorporated, Harrisburg, Pa.

[21] Appl. No.: 724,810

[22] Filed: Sep. 20, 1976

Related U.S. Application Data

[63] Continuation-in-part of Ser. No. 485,410, Jul. 3, 1974, abandoned.

[51] Int. Cl.$^2$ .............................................. C23C 3/02
[52] U.S. Cl. ...................................... 427/98; 427/261; 427/304; 427/306; 427/307; 106/1.05; 106/1.24
[58] Field of Search .................. 427/92, 306, 96, 304, 427/305, 98; 106/1

[56] References Cited

U.S. PATENT DOCUMENTS

| | | | |
|---|---|---|---|
| 3,558,352 | 1/1971 | Castrucci et al. | 427/89 |
| 3,573,973 | 4/1971 | Drotar et al. | 427/98 |
| 3,775,121 | 1/1973 | Sharp | 96/38.4 |
| 3,821,016 | 6/1974 | De Angelo | 427/54 |

OTHER PUBLICATIONS

Brenner, "Electroless Plating Comes of Age", *Metal Finishing*, Dec. 1954.

*Primary Examiner*—Ralph S. Kendall
*Attorney, Agent, or Firm*—Russell J. Egan

[57] ABSTRACT

A method is disclosed for the generation of circuit patterns on a polyimide type of substrate by preconditioning the substrate's surface with a hydrazine/caustic solution, depositing a catalyst on the surface treated polymer, and exposing the polymer with the catalyst thereon to a bath having a metal therein capable of deposition electrolessly on the polymer surface containing catalyst.

13 Claims, 2 Drawing Figures

METHOD OF MAKING SENSITIZED POLYIMIDE POLYMERS, HAVING CATALYST AND ELECTROLESS METAL, METAL DEPOSITS THEREON AND CIRCUIT PATTERNS OF VARIOUS METALLIZATION SCHEMES

CROSS REFERENCE TO RELATED APPLICATION

The present application is a continuation-in-part of application Ser. No. 485,410 filed July 3, 1974, now abandoned.

BACKGROUND OF THE INVENTION

With the increasing use of the organic base substrates for providing circuits of intricate patterns, greater demands have been placed on the product performance of these circuits and thus on the organic substrates. Circuits of various patterns may be formed by diverse means, but an electroless metal deposition method has become increasingly more attractive as a method for forming these circuit patterns on flexible substrates. If necessary, these circuits may also be subsequently built up electrolytically with an appropriate metal.

SUMMARY OF THE INVENTION

According to the present invention, it has been discovered that when polyimide substrate, such as film or, polyimides such as disclosed in the patents mentioned in U.S. Pat. No. 3,436,372 (the disclosure of which is incorporated by reference) are treated with aqueous hydrazine/caustic solution, excellent adhesion of a catalyst is achieved between the substrate and the catalyst as characterized by the adhesion of the electroless deposit on the substrate.

The synergistic combination of an aqueous hydrazine-alkali hydroxide solution renders the surfaces of substrates prepared from polyimides type polymers (by chemical attack) receptive to palladium metal salts; this salt on the polyimide polymer is converted to a catalytic species for the deposition of a metal from an electroless plating bath. Hence, the hydrazine-alkaline solution attacks the polyimide chain in such a way that the palladium salt adherently complexes with the polymer. The end result is characterized by an exceptionally tenaciously adhering electrolessly deposited metal plating to the polymer.

Still further, it has been found that a polyimide film such as Kapton$^{(R)}$ a product of DuPont Inc., (or H-film) when treated with the preconditioning solution consisting of hydrazine hydrate, sodium hydroxide, triethanolamine and water, for a given period, followed by a water rinse and full immersion into a palladium chloride solution, will readily accept copper from an electroless plating bath without further processing of the film. The electroless copper plated film may then be resist coated, the resist developed, a masked area formed, and then selectively plated and back etched. The chemically treated surface is suitable for catalyst acceptance, and an electroless copper deposition can thereby be achieved.

As another aspect of this invention, it has been found than when using hydrazine hydrate/sodium hydroxide etching solution in combination with the other catalyzing systems to prepare a surface for electroless plating such as a palladium chloride-stannous chloride catalyst, as disclosed in U.S. Pat. No. 3,562,005, the catalyst "pickup" can be controlled by post treating the surface of the polyimide film after immersion by dipping the treated film in a 1% sodium hydroxide solution or a dilute potassium hydroxide or ammonium hydroxide solution. A dip for 30 seconds to about 2 minutes, will modify the amount of catalyst the film is capable of accepting in a catalyst deposition step. Of course, the modified area can also be fully reactivated by immersing in the hydrazine/sodium hydroxide solution. As now discovered, excessive amounts of catalyst deposition and reduction will be avoided and the optimum catalyst amount obtained, adhesion improved, and adjustment of end product properties readily practiced. Thus, as a result of concentration of the solution and dwell time, the 1% sodium hydroxide post treatment of the film will provide an adequate and sufficient pickup of the various palladium catalyst for obtaining a completely catalyzed polyimide surface, which, thereafter can be exposed to one of the previously mentioned metals in an electroless bath. If a selective pattern is not sought at the outset, the whole surface may be treated in the hydrazine/sodium hydroxide solution followed by the sensitizer, activator, and accelerator solutions, the thus treated film plated in an electroless bath, coated with a resist, and subsequently subjected to electrolytic deposition and then back-etched in the areas in which the electrolessly deposited metal is found, in a manner as it is well known in the art.

BACKGROUND FOR CONDITIONING THE SURFACE OF PLASTICS FOR PLATING

The prior art has usually taught that the surface of a plastics material must be roughened by physical or chemical means, such as sand blasting or chemical etching prior to plating by an electroless method. The reason for the roughening is the deposited metal can mechanically key into the roughened surface. The chemical inertness of polyimide film makes it difficult to roughen by standard chemical etchants such as chrome-sulfuric acid, and sand blasting or horning the film is difficult to control in a manufacturing operation. Without some type of surface roughening the adhesion of the electroless plating is not satisfactory.

U.S. Pat. No. 3,395,057 describes a chemical method for milling holes in polyimide films and for texturing its surface to enhance the adhesive bonding of a metal foil by using hydrazine solutions. "Dimensional Stability and Adhesion Studies on Kapton$^{(R)}$ Polyimide Films for Flexible Circuitry" by J. A. Kruez presented at the Institute of Printed Circuits Meeting Apr. 22, 1974, at Miami Beach, Florida, recommends that hot concentrated sodium or potassium hydroxides solution be used for attaching Kapton$^{(R)}$. "The Reaction of Hydrazine with Polyimides and Its Utility" by J. I. Jone in the Journal of Polymer Science, part C No. 22, pp. 773–784 (1969), reports that hydrazine hydrate will disintegrate and dissolve polyimide films (Kapton$^{(R)}$) according to the following equation:

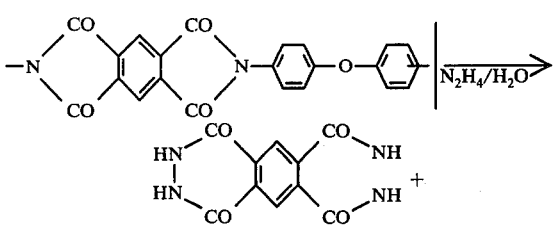

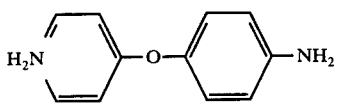

EFFECT OF SURFACE TREATMENT ON PLATING ADHESION

The present invention relates to a method of surface treating polyimide films for electroless plating which method etches faster than hydrazine hydrate, but more importantly improves the adhesion of electroless plated metals and increases the plating speed. In addition, these solutions are safer to use, i.e., they have a lower flash point and they operate at room temperature. Finally, the solutions are more econimical since they contain less hydrazine and can be regenerated.

We have found that a combination of hydrazine hydrate and sodium or potassium hydroxides renders the polyimide's surface chemically active such that it tenaciously holds the palladium salt while by themselves the ingredients are hardly effective at all in activating the polyimide surface for plating. The solutions are stable over long periods (months). The reaction products do not hinder the etching rate and the solutions can be reused by simply filtering out reaction products and adding any additional hydrazine hydrate or caustic if needed.

The synergistic effect of the mixture is provided in Table II where the solution mixtures are listed in volume percentages for a 85 Wt.% hydrazine hydrate solution and 25 Wt.% sodium hydroxide solution. Three mil Kapton$^{(R)}$ H film was used as the substrate.

The following electroless plating cycle was used to prepare the samples for peel strength measurements:

TABLE I

| Solution* | Time-Mins. |
|---|---|
| Hydrazine/Caustic | 2½ |
| Rinse | 2 |
| HCl dilute | Dip |
| MacDermid 907D Activator (a colliodal dispersion of a tin-palladium salts in a hydrochloric acid solution produced by MacDermid Inc., Waterbury, Connecticut) | 2 |
| Rinse | 1 |
| MacDermid 9071 Accelerator (a stannous chloride in hydrochloric acid produced by MacDermid Inc., Waterbury, Connecticut) | 2 |
| Rinse | |
| Dynachem 240 Electroless Copper (a copper sulfate, formaldehyde sodium hydroxide and tartrate solution produced by Thiokol/Dynachem Corp., Tustin, California) | 1 |
| Rinse | ½ |

*All solutions at Room Temperature

The samples were dried for 10 minutes at 65° C and electroplated to a thickness of 1 mil in a copper sulfate bath operating at room temperature with a maximum current density of 30 ampere/ft$^2$. The drying anneals the surface and improves the bond between the polyimide and the metal. In lieu of forced hot air drying, room temperature aging is equal beneficial, or the film can be dried after electroplating at 95° C for 4 hours.

Annealing or heat treating the polyimide at some point after the hydrazine-caustic treatment is a necessary step to obtain maximum peel strength. Annealing the polyimide which was not exposed to the synergistic mixtures or treated with hydrazine or caustic solutions separately did not improve the adhesion. The evidence suggests that annealing reconstitutes the polyimide surface for the hydrazine-caustic treatment and improves the cohesive strength of the surface layer. While for polyimide surfaces which were not treated with the hydrazine-caustic solution or treated with only one component, the amount of palladium catalyst pick-up was less and was not as tenaciously held, this was evidence by the slow rate of metal deposition and the peel failure was at the metal-plastic interface.

In regards to peel strength measurements, 5 samples were tested for each reported value. The specimen were cut from a 6 × 1 ¾ inches strip of plated stock. The specimens were ¼ wide and 3 long. The peel strength were measured by attaching the specimen to a test fixture (German wheel). To initiate the peel, the deposited metal was separated from the Kapton$^{(R)}$ by slicing with a surgical knife along the interface at one end of the specimen. The released metal film was clamped in the jaws of an Instron and the German wheel pulled in a downward direction at a rate 0.1/min. The force to peel the metal from the film was recorded and the average values reported.

For the higher peel strengths (>2 lb./in. of width) the failure was cohesive failure in the Kapton just below the interface. For lower peel strength values, the failure was at the metal-Kapton interface.

The reported results in the Table II also include etching rates of the hydrazine/caustic solutions. Three mil Kapton H film was used as the substrate and weight losses for immersion times up to 10 minutes were measured. The calculated etch rates were reported in a range of values in percent weight loss per minute.

The relative electroless plating efficiency pell strengths and flash point for the solutions' strength are listed in the Table II.

TABLE II
EFFECT OF HYDRAZINE/CAUSTIC MIXTURE RATIOS ON THE ETCHING AND PLATING OF KAPTON®

| 85 W/O $N_2H_4 \cdot H_2O$ | 31 W/O NaOH | Etch Rate % Wt. Loss/min. | Plating Description | Peel Strength #/in. | Flash Point ° C |
|---|---|---|---|---|---|
| 100 | 0 | 0.0 – 0.2 | Plated slowly | *A | 52 |
| 90 | 10 | 5.5 – 6.5 | *C | 4.5 | 81 |
| 80 | 20 | 6.5 – 8.0 | *C | 4.3 | 83 |
| 70 | 30 | 8.0 – 9.0 | Plated fastest | 4.6 | 96 |
| 60 | 40 | 5.5 – 6.5 | — | 3.2 | 99 |
| 50 | 50 | 3.0 – 4.0 | Plated uniformly | 2.4 | 118 |
| 30 | 70 | 2.5 – 3.5 | *C | *B | None |
| 25 | 75 | — | Plated all over | 1.6 | " |
| 20 | 80 | 1.0 – 1.5 | *C | *A | " |
| 0 | 100 | 0.0 – 0.2 | Did not plate | *B | " |

*A - The peel strength of the plated samples was too low to be accurately measured.
*B - Was not measured.
*C - Was not observed.

As seen from Table II, the maximum etching rate is 70/30 hydrazine/caustic mixture. The maximum peel strength is in this range as well. From relative point of view the electroless plating takes place in the shortest time in this concentration ration also. If the hydrazine/caustic mixtures are highly diluted with water, the adhesion is decreased. There is no adhesion of the plating with just a water cleanng of the surface. The chromesulfuric acid and the para toluene sulfonic acid surface treatments were rejected because of low adhesion and poor reproducability of the deposition process.

Wetting agents such as triethenolamine may be added to the etching solution but are not mandatory.

The density of the 70/30 hydrazine caustic solution is 1.13 g/ml, the kinematic viscosity is 3.32 centistokes and the surface energy is 58 dyne-cm.

DETAILED DESCRIPTION OF THE INVENTION

Turning now to the invention and discovery in greater detail, it has been found that a polyimide film such as Kapton[R] when treated with an aqueous hydrazine and sodium hydroxide (potassium hydroxide can also be used) and optionally in the presence of an triethanol amine, a polyimide polymer undergoes a chemical change which makes the polyimide chemically active towards the compositions which are catalytic to the metals in an electroless bath.

Other amines can be included in the hydrazine hydrate/sodium hydroxide solution with which the polyimide is treated for subsequent plating, thus in addition to triethanolamine, diethanolamine or monoethanolamine or mixtures of these can be used. The amines are added from 1 to 10% by weight of the total solution weight. The amines apparently act as wetting agents. In order to slow the surface attack of the solution, the solution can be diluted with water. Generally, the alkali hydroxide is from 10 to 30% by weight of alkali in the solution but a range from <5% alkali hydroxide to >95% hydrazine to >95% alkali hydroxide to <5% hydrazine, balance water within the above concentration percentages is acceptable (Table 2). With a 30% by weight of an aqueous sodium hydroxide (or potassium hydroxide) solution, combined in equal parts with 85% by weight aqueous hydrazine hydrates solution and an aqueous triethanolamine solution (30% by weight), the surface attack for the polyimide at 80° C is about 3 mils per minute. However, sensitization, i.e., catalyst pickup and electroless plating, can be achieved at low temperatures (0° to 30° C) and the upper range 30° C need not be used to accomplish the same effect. The rate of attack is only a measure of the relative activity of the solution vis-a-vis the polyimide; but the efficacy of the system is determined by the pickup of the electroless metal.

In addition, the hydrazine and alkali hydroxide as well as the amine solution is stable and can be stored for a prolonged period such as for 4 weeks and longer in a container with only a slight loss in hydrazine concentration.

The polyimide base material or substrate such as a film or sheet is useful in a thickness from 0.5 mils to 5 mils. Polyimide sheet or film sold under the trademark KAPTON (also known as H film) and numerous polyimide varieties have been disclosed such as in the prior art U.S. Pat. No. 3,426,372, issued Apr. 1, 1969. The disclosures with respect to the polymers disclosed or identified in these patents are incorporated by reference herein.

It has also been found that after immersion of the thus sensitized polyimide polymer in palladium chloride catalyst solution and spreading the solution over the polyimide film and removal of excess solution from the polymer, excessive palladium metal deposition can be controlled by immersion of the polymer in a one percent sodium hydroxide solution. The immersion time in the one percent sodium hydroxide solution is for a period of 30 seconds to 2 minutes. By the alkali treatment, the adhesive failure of the catalyst layer and substrate is minimized.

With reference to the drawings herein, these illustrate the end products of the invention suitable for application in complex circuit design. These are merely illustrations of the invention and other embodiments are evident therefrom.

Figure 1:
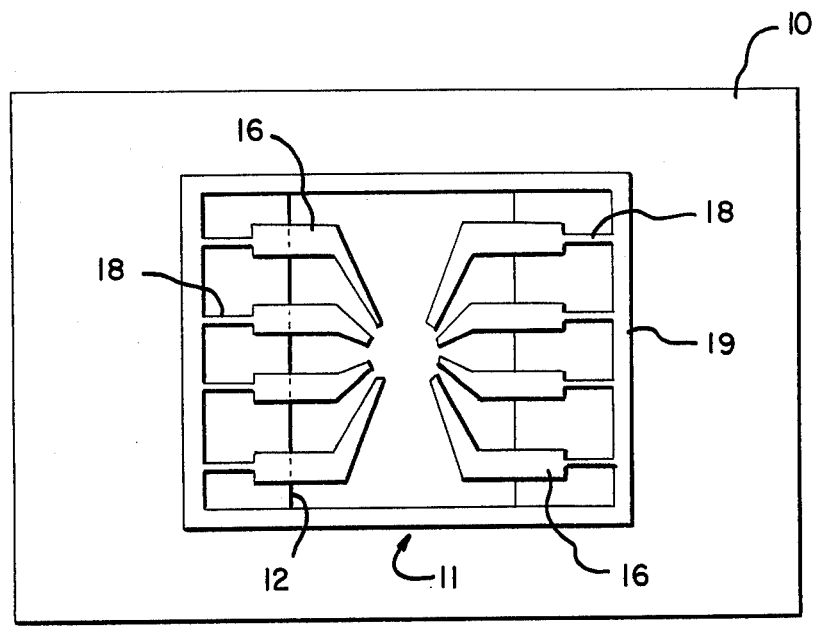
FIG. 1 is a plan view of a circuit pattern in a lead frame configuration.
Figure 2:
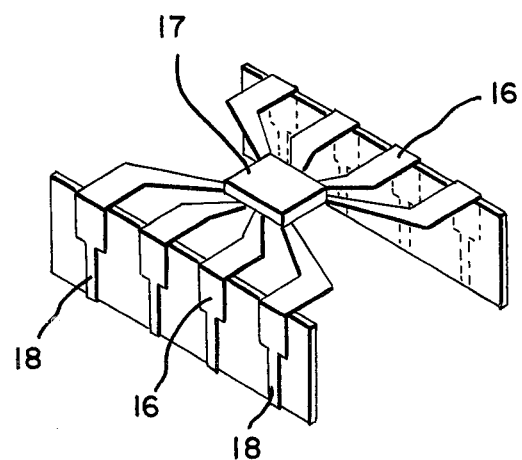
FIG. 2 is a perspective view of the lead frame circuit shown in FIG. 1.

With reference to FIG. 1, it illustrates a lead frame circuit pattern. The polymer is identified as 10 and is Kapton (or H film as it is also known). The preferable thickness of the film is 3 mils although they are available in a thickness range of 0.5 to 5 mils. The lead frame 11 has clamp lines 12 used for mounting the frame and leads 16 which go to a central core 17. An integrated circuit chip (not shown) is placed in the core 17, and is connected by leads 16 to a circuit. Spider legs 18 hold the leads 16 to the frame 19. The subsequent connection of leads 16 is to another circuit such as found, for example, in the hand held calculators.

With reference to the catalyst which can be employed in the present process for total surface or commonly called plastic plating, besides the palladium chloride, and palladium chloridecolloidal tin, also palladium chloride-tin chloride solution can be used. The last is a mixture of palladous dichloride, stannous dichloride, stannic tetrachloride and hydrochloric acid. Additional catalyst combinations which can be used in conjunction with the sensitized polyimide surface are disclosed in the above-mentioned U.S. Pat. No. 3,562,005 and are incorporated by reference herein.

Still further, the above catalyst solutions can also be used by exposing the hydrazine/sodium hydroxide activated polyimide surface to the catalyst solution to deposit a sufficient amount of the metal so that when the catalysts and polyimide are exposed to the electroless bath, the metal in the bath will be deposited on the total exposed area.

Of the suitable electroless solutions, which may usefully be employed, the copper baths are disclosed in U.S. Pat. Nos. 3,033,703; 3,257,215; 3,485,643; and 3,562,038; nickel baths are disclosed in U.S. Pat. Nos. 3,531,201; 3,537,878; 4,562,038 and the gold baths are disclosed in U.S. Pat. No. 3,300,328. The last may be used with a nickel precoating which is employed. Additional baths, which may be usefully employed, are available in the art.

Examples of some of the catalyst and electroless metal bath formulations are illustrated below:

Catalyst which operate at room temperature with immersion times from few seconds to minutes:

a. Sensitizer Formulations:

| I. | |
|---|---|
| Stannous Chloride | 100 gm/1 |
| Sodium Hydroxide | 150 gm/1 |
| Sodium Potassium Tartrate | 172 gm/1 |

-continued

|   | |   |
|---|---|---|
| II. | Palladium Chloride | 10 gm/1 |
|  | Hydrochloric Acid | 40 ml/1 |
| III. | Stannous Chloride | 20 gm/li |
|  | Hydrochloric Acid | 10 ml/li |
| b. Activators: | | |
| I. | Silver Nitrate | 1–10 gm/1 |
|  | Ammonium Hydroxide | 10–20 ml/1 |
| II. | Palladium Chloride | 0.1–1 gm/1 |
|  | Hydrochloric Acid | 5–10 ml/1 |
| III. | Gold Chloride | 0.5–1.0 gm/1 |
|  | Hydrochloric Acid | 10 ml/1 |

The catalyst is used in a two-step application, by first depositing the sensitizer and then the activator, however, these baths may be combined in a one step operation, e.g., the black colored tin-palladium colloidal dispersion.

| Electroless Coppers: | |
|---|---|
| I. Copper Sulphate | 10 gm/1 |
| Sodium Hydroxide | 10 gm/1 |
| Formaldehyde (37–41% W/V) | 10 ml/1 |
| Sodium Potassium Tartrate | 50 gm/1 |
| II. Cupric Oxide | 3.0 gm/1 |
| Sodium Hypophosphite | 10 gm/1 |
| Ammonium Chloride | 0.1 gm/1 |
| Bath Temp.: Ambient | |

Sensitizer as quoted from the book by W. Goldie "Metallic Coating of Plastics" Electrochemical Publication Limited, 1968.

"After preconditiong and prior to electroless deposition, the polymer is usually subjected to a pretreatment stage, consisting normally of two steps. The first of these is commonly referred to as sensitising, although the term priming has also been used. The second step, activation, has sometimes in the past been referred to as seeding. Confusion has, therefore, arisen through lack of standard nomenclature and the fact that either or both steps may be omitted, combined, or even interchanged. As some doubt exists concerning the function and mechanism of sensitisers and activators, this has not helped to clarify the situation. The terminology used in this chapter is believed to be the standard likely to be officially adopted in the near future."

| | |
|---|---|
| III. Copper Sulphate | 13.8 gm/1 |
| Sodium Potassium Tartrate | 69.2 gm/1 |
| Sodium Hydroxide | 20 gm/1 |
| Formaldehyde (36% W/V,* 12.5% CH$_3$OH) | 40 ml/1 |
| 2-Mercaptobenzothiazole | 0.003 % |
| *weight by volume | |
| Bath Temp.: Ambient | |
| Electroless Nickel: | |
| I. Nickel Chloride | 80 gm/1 |
| Sodium Citrate | 100 gm/1 |
| Ammonium Chloride | 50 gm/1 |
| Sodium Hypophosphite | 10 gm/1 |
| Bath Temp.: 180° F | |
| II. Nickel Chloride Hexahydrate | 20 gm/1 |
| Ethylene Diamine (98%) | 45 gm/1 |
| Sodium Hydroxide | 40 gm/1 |
| Sodium Borohydride | 0.67 gm/1 |
| Bath Temp.: 180° F | |
| Electroless Cobalt: | |
| I. Cobalt Chloride Hexahydrate | 30 gm/1 |
| Sodium Citrate Pentahydrate | 35 gm/1 |
| Ammonium Chloride | 50 gm/1 |
| Sodium Hypophosphite, Monohydrate | 20 gm/1 |
| Bath Temp.: 180° F | |
| II. Cobalt Sulphate, Heptahydrate | 24 gm/1 |
| Ammonium Sulphate | 40 gm/1 |
| Sodium Hypophosphite | 20 gm/1 |
| Sodium Citrate | 80 gm/1 |
| Sodium Lauryl Sulphate | 0.1 gm/1 |
| Bath Tempp.: 180° F | |
| or: | |

-continued

| | |
|---|---|
| b. Copper Fluoborate | 60 oz./gal. |
| Copper (as metal) | 16 oz./gal. |
| Temp. - 120° F | |
| or: | |
| c. Copper Cyanide | 2–3.5 oz./gal |
| Sodium Cyanide | 3.7–5.9 oz./gal. |
| Free Sodium Cyanide | 1.5–210 oz./gal. |
| Sodium Hydroxide | 0–½ oz./gal. |

EXAMPLE I

A Kapton tradmarked polyimide polymer film of a thickness of 3 mils is immersed from 1 to 3 minutes in an aqueous solution of equal parts of 25% sodium hydroxide, by weight, 85% hydrazine hydrate, by weight, and triethanol amine 10% solution by weight. Thereafter the film is sprayed (or immersion) rinsed with cold water, followed by immersion into a 1%, by weight, palladium chloride aqueous hydrochloric acid solution, (activator only, b. II. above) rinsed in cold water. The surface accepts nickel from Electroless Nickel I. The film is then resist coated, then selectively electroplated, the resist is removed and the plating back-etched.

The above chemical treatment makes possible the attraction of palladium chloride to the Kapton substrate prior to electroless plating, resulting in excellent adhesion of the plating to the Kapton.

EXAMPLE 2

An embodiment of the process which gives adhesion values of 3 lbs./inch of width is carried out in the following stepwise sequence to produce a circuit pattern as in FIG. 1 by the semiadditive process. A 3 mil Kapton film is treated as follows:

Step 1

33% V/V of 85% W/W Hydrazine-Hydrate
+ 33% V/V of 25% W/V Sodium Hydroxide
+ 33% V/V Triethanolamine
Room Temperature — 2 to 3 minutes V/V is volume by volume; W/W is weight by weight Step 2

Cold Water Rinse — 2 to 5 minutes

Step 3

1% Sodium Hydroxide (optional)

Step 4

Water Rinse (optional)

Step 5

Stannous Chloride 10 gm/1
Hydrochloric Acid 10 ml/1
Room Temperature — 1 to 3 minutes Step 6

Cold Water Rinse — 1 to 2 minutes

Step 7

Palladium Chloride 0.05 W/V% in Hydrochloric Acid 1 N 30 secs. to 2 minutes

Step 8

Cold Water Rinse

Step 9

Electroless copper, Electroless Nickel, electroless cobalt (as described earlier) 3 to 5 minutes

Step 10

Cold Water Rinse — 1 to 2 minutes

Step 11

Resist Coat and Develop Image

Step 12

Thereafter the film with a circuit pattern on it is electroplated in suitable electroplating solution such as:
a. Copper Sulfate — 28.0 oz./gal.
Sulfuric Acid — 7.0 oz./gal.
Room Temp.

EXAMPLE 3

A substrate of a Kapton polyimide film (Type H film) is introduced in a vessel containing 70% by volume hydrazine hydrate (85% by weight) and 30% by volume sodium hydroxide (25% by weight) for 2 minutes. It is rinsed and introduced in a vessel containing as catalyst: Sensitizer a. II and as activator b. II of the above listed compositions. After rinsing again, the film is passed onto a vessel holding electroless copper solution (defined as Electroless Copper III).

In the above-described sequence, there should be an adequate rinse after each treatment. The water should be of reasonable quality with a temperature of 17°–25° C. Spray or immersion rinses are both suitable. Solution temperatures employed should be kept between 20°–25° C; and dwell times of the film should be as indicated. Sticking of the electrolessly plated stock and heavy oxidation on a take-up reel can be eliminated by proper drying.

The catalyst and electroless copper should be controlled such that concentrations of the catalyst and accelerator should be held between 75–100%. The electroless copper should be held between 80–100% to give maximum plating. Products obtained are analyzed as follows:

The copper metal should cover 98% of the useable surface area of the film and 90% of any hole wall surface and there should be no voids or cracks at the junction of any hole wall and conductor or terminal areas. Any voids present in any hole wall should nowhere produce a circumferential annular void of more than 40%, testing is by visual examination, at a monification of 7 to 10, such as the surface and any hole wall areas.

Test sample preparation is as follows. At least five test specimens from a machine run, in order to fully evaluate the quality of that stock are taken. The samples should be at least 5 inches long. These strips should be blanket plated on one side only, with 0.2 mil. Copper sulfate, copper fluoroborate, and copper cyanide electrolytic plating baths (previously described) are suitable for this purpose. The sample and a plate of 0.8 - 1.0 mils of copper using any of the previously listed electrolytic plating baths at room or elevated temperatures are taken and then additional metals needed in the end products are electrolytically plated thereon.

After rinsing the products thoroughly, these products are dried and baked at 80° C for 5 to 20 minutes. A strip of ¼ wide is cut from the product and adhesion testing is made. The adhesion testing is accomplished by holding the end of the ¼ wide strip and loosening the copper from the film. When adhesion values are reasonably high, it becomes difficult to test without destroying the film. An expeditious method for startng a peel is to hold the corner of the sample over a flame to char the film; the peel will be lower in the charred area so the first ¼-½ of adhesion are disregarded.

For a 1 mil polyimide (Kapton or H film) film, the adhesion should surpass the tear initiation strength of the substrate. On films of greater thickness, the ability to tear the film before being able to remove the coppe is desirable. All adhesion values are given for 90° peel test. Adhesion of deposited and plated metals after solder immersion was also determined, i.e., the thermal stability of the bond between the copper and the polyimide film was also determined.

The method for testing was as follows. From the five products previously prepared, additional ¼ wide strip is cut, this strip is immersed in a molten solder pot held between 450°–475° F, for 10 seconds; flux is not needed. The strip is removed and is allowed to cool for 10 minutes. The adhesion testing procedure as outlined above, i.e., 90° peel, is employed.

The adhesion of the products should not be degraded more than 10% after solder immersion as outlined above (90° peel) when treated in accordance to the described procedure.

In addition, adhesion of deposited and plated metals after wire bonding were applicable is tested for acceptability of the electrolessly deposited stock for use with ultrasonic or thermal compression wire bonded microcircuits. This testing procedure is designed to subject the end product to assembly type rigors so as to determine whether the quality of the produced stock is acceptable. Because of the individuality of each circuit, there can only be a standardized test pattern with some line width that will encompass most end uses. The pattern itself is geared towards line widths of 0.005 – 0.010. These line widths give the broadest coverage of microcircuit applications.

The wire should be stitched into a loop between two adjacent fingers. The loop should be pulled with a bond tester such as Model MBT-a available from Engineered Technical Products, 3421 U. S. Highway 22, Somerville, New Jersey 08876.

The wire should fail upon pulling, there should be no lifting of the metal finger from the plastic either during the wire bonding or subsequent pulling operation.

Inspection of through-hole quality after solder immersion has also been carried out.

Five test specimens of a plated through-hole circuit are immersed for 10–15 seconds in a 450°–475° F molten solder pot. The solder is removed and is allowed to cool. Then, by any acceptable technique, the holes are cross-sectioned and examined. There should be no evidence of lifting of copper from the walls of the hole. There should be no evidence of cracking of the copper either at the corners or the barrel of the hole. The ratio of the plated copper on the surface to the plated copper in the hole should be no smaller than 1:1.5.

EXAMPLE 4

In a process as described in Example 3 using the polyimide polymer of a thickness of 3 mils but replacing the above-identified catalyst in Example 3 with a catalyst identified as a. II and b. III, as well as using an electroless copper bath identified above as III, an excellent circuit pattern was obtained on the polyimide polymer substrate. The circuit pattern has excellent adhesion characteristics of the electrolessly deposited copper. Further, an electrolytically deposited copper was plated on the electroless coppder as outlined above in the above-described process in Step 12. The electrolytic bath was that identified as a. in Step 12 above and plating was achieved at ASF of 10, at a bath temperature of 15°–25° C whereby a deposit of a thickness of 1 mil was obtained.

In addition to copper, nickel and cobalt, gold is deposited from an electroless bath.

The circuits may be electroplated over the electroless deposits with typical electrolytically depositable metals. Further, tin may be overplated for better solder adhesion. Typical tin, as well as tin lead electrolytic compositions, are listed in "Metal Finishing Guidebook Directory", Metal and Plastics Publications Inc., Westwood, New Jersey (published annually). This publication provides sufficient description of various electrolytic compositions suitable for the present purposes.

The hydrazine sensitizing solution is reusable and is periodically augmented so as to maintain the required concentration. When the concentration of the solubilized polyimide exceeds a certain limit, it precipitates undue amounts of contaminants, these are easily removed by filtration.

What is claimed is:

1. A method for electrolessly plating a pattern of metal on a polyimide film with good adhesion therebetween comprising the steps of: preconditioning said polyimide film by immersion in a hydrazine-alkali metal hydroxide solution to at least partially etch a surface of said film; neutralizing said surface by rinsing in a dilute hydrochloric acid solution; immersing said film thus preconditioned in tin-palladium solutions separately in sequential steps or in a mixture of these solutions; rinsing said film to wash off loosely held catalyst, immersing said film in an electroless metal plating bath; and depositing on said film a metal from said electroless metal plating bath on areas exposed to said catalytic material.

2. The method as defined in claim 1 wherein the hydrazine alkali metal hydroxide solution has triethanolamine added thereof in order to improve the wettabilithy of the film.

3. The method as defined in claim 1 wherein said palladium catalyzed film is immersed in an electroless copper bath.

4. The method as defined in claim 1 wherein said palladium catalyzed film is immersed in an electroless cobalt bath.

5. The method as defined in claim 1 wherein said palladium catalyzed film is immersed in an electroless gold bath.

6. The method as defined in claim 1 wherein the said palladium catalyzed film immersed in an electroless nickel bath containing sodium hypophosphite as a reducing agent.

7. The method as defined in claim 6 wherein said immersion in the electroless nickel bath is for 5 to 20 seconds.

8. The method as defined in claim 7 wherein said polyimide film with nickel deposited thereon is immersed in an electroless copper bath to deposit copper thereon.

9. A process for chemically preconditioning a polyimide film in order to electrolessly metal plate on said film with high adhesion which comprises the steps of:
   a. at least partially etching the surface of said polyimide film by immersion in a solution of hydrazine, unsymmetrical dimethyl hydrazine, monomethyl hydrazine, or phenyl hydrazine, or mixtures of same in admixture with an alkali metal hydroxide solution;
   b. rinsing and neutralizing the thus treated film;
   c. immersing said film in a catalyst solution known to initiate metal plating on said etchedareas in an electroless metal plating bath; and
   d. immersing said catalyzed, preconditioned film in an electroless metal plating bath to deposit a metal catalytically from said bath onto the film.

10. The process as defined in claim 9 wherein said catalyst solution comprises a catalyst metal salt in an acidic solution, said metal salt being capable of being rendered catalytically active on said surface.

11. The process as defined in claim 10, wherein the catalyst is palladium chloride.

12. The process as defined in claim 10. further comprising a catalyst sensitizer of a tin salt.

13. The process as defined in claim 10 wherein the catalyst is palladous dichloride and a catalyst sensitizer therefor is a stannous chloride. /

* * * * *

UNITED STATES PATENT OFFICE
CERTIFICATE OF CORRECTION

Patent No. 4,078,096          Dated March 7, 1978

Inventor(s) JOHN PETER REDMOND ET AL

It is certified that error appears in the above-identified patent and that said Letters Patent are hereby corrected as shown below:

Claim 2, column 11, line 48 "tabilithy" should read - - - tability - - - .

Claim 9, column 12, line 32, "etchedareas" should read - - - etched areas - - - .

Claim 11, column 12, line 42, after "catalyst" it should read - - - salt - - - .

Signed and Sealed this

Fifth Day of September 1978

[SEAL]

Attest:

RUTH C. MASON
Attesting Officer

DONALD W. BANNER
Commissioner of Patents and Trademarks